(12) United States Patent
Lee

(10) Patent No.: US 8,509,022 B2
(45) Date of Patent: Aug. 13, 2013

(54) FUSE SET AND SEMICONDUCTOR INTEGRATED CIRCUIT APPARATUS HAVING THE SAME

(75) Inventor: Jong Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 194 days.

(21) Appl. No.: 13/092,238

(22) Filed: Apr. 22, 2011

(65) Prior Publication Data
US 2011/0199150 A1    Aug. 18, 2011

Related U.S. Application Data

(63) Continuation-in-part of application No. 12/483,440, filed on Jun. 12, 2009, now Pat. No. 7,952,951.

(30) Foreign Application Priority Data

Dec. 26, 2008 (KR) .................. 10-2008-0134272

(51) Int. Cl.
*G11C 5/25* (2006.01)
*G11C 17/16* (2006.01)

(52) U.S. Cl.
USPC .................. 365/225.7; 365/63; 365/200

(58) Field of Classification Search
USPC ........................... 365/96; 327/525
See application file for complete search history.

(56) References Cited

U.S. PATENT DOCUMENTS

| 5,636,172 | A  | * | 6/1997  | Prall et al. ................ 365/225.7 |
| 6,661,330 | B1 | * | 12/2003 | Young ........................ 337/297  |
| 6,900,516 | B1 | * | 5/2005  | Banisch et al. ............. 257/529    |
| 6,903,992 | B1 | * | 6/2005  | Yoon ......................... 365/225.7 |
| 7,361,967 | B2 | * | 4/2008  | Takahashi et al. .......... 257/529     |
| 7,830,205 | B2 | * | 11/2010 | Kim .......................... 327/565   |
| 7,952,951 | B2 | * | 5/2011  | Lee .......................... 365/225.7 |
| 8,279,700 | B2 | * | 10/2012 | Wada et al. ................ 365/225.7  |

FOREIGN PATENT DOCUMENTS

| KR | 10-0324816 B1 | 2/2002 |
| KR | 10-0448909 B1 | 9/2004 |

* cited by examiner

*Primary Examiner* — Tan T. Nguyen
(74) *Attorney, Agent, or Firm* — William Park & Associates Patent Ltd.

(57) ABSTRACT

A fuse set includes a first row constituted by a plurality of fuses which are arranged with a first spacing; a second row including a plurality of fuses which are disposed to correspond to the fuses of the first row on the same plane, and separated from the fuses of the first row with a second spacing; and a connection part disposed between the first row and the second row and electrically connected with the plurality of fuses of the first row and the plurality of fuses of the second row, wherein the connection part and the pluralities of fuses of the first and second rows are disposed on different planes.

13 Claims, 7 Drawing Sheets

FUSE SET AND SEMICONDUCTOR INTEGRATED CIRCUIT APPARATUS HAVING THE SAME

CROSS-REFERENCES TO RELATED APPLICATION

The application is a continuation-in-part of the U.S. patent application Ser. No. 12/483,440 filed Jun. 12, 2009 and titled "Small-sized fuse box and semiconductor integrated circuit having the same", which is incorporated here in by reference in its entirety.

BACKGROUND

1. Technical Field

The present invention relates to a semiconductor integrated circuit, and more particularly, to a fuse set and a semiconductor integrated circuit apparatus having the same.

2. Related Art

As semiconductor integrated circuits become more and more reduced in size, the number of devices which are included into a given semiconductor chip increases. As the number of devices in semiconductor integrated circuits increase, then the frequency of defects increases simply because of the increased number of devices. This can adversely affect the yield of the semiconductor devices by making an unacceptable percentage of these semiconductor devices that are faulty.

In a conventional semiconductor integrated circuit, to reduce the density of the defects, a repair technique in which a defective cell is replaced with an additional ancillary cell has been proposed. This repair operation can be executed by displacing a redundancy circuit block in the semiconductor integrated circuit. The redundancy circuit block has to somehow recognize a defect position in the semiconductor integrated circuit and then to subsequently change an address path away from the defect cell to an additional ancillary cell. Here, the position of the address associated with the defective cell is stored in a fuse that is included in the redundancy circuit block.

The redundancy circuit block consists of a fuse block, which has a plurality of address fuses, and a plurality of redundancy circuits connected to the fuse blocks.

FIG. 1 is a plane view showing an example of a fuse box in a conventional column fuse block.

Referring to FIG. 1, address fuses 10, which are disposed away from each other, are arranged in a space defined by a fuse box 20. The address fuses 10 forms fuse sets, each of which has four fuses, and an individual redundancy circuit (not shown) is connected to the fuse set. The address fuses 10 that form one fuse set are connected to the dependency circuit (not shown) through one of the wires 30a, 30b, 30c and 30d.

The wires 30a, 30b, 30c and 30d are routed to the circumference of the fuse box 20 in consideration of the blowing of the address fuses 10. Furthermore, the wires 30a, 30b, 30c and 30d are separately disposed along both sides of the fuse box 20, so that these wires are disposed sufficiently apart from each other in order to prevent or minimize any electrical interference therebetween. In addition, each of the wires 30a, 30b, 30c and 30d has to maintain an appropriate line width needed to prevent a signal delay.

However, since the conventional wiring layers 30a, 30b, 30c and 30d are formed using the same wiring lines as the fuses, laser beams are likely to be radiated to the wiring layers 30a, 30b, 30c and 30d when blowing the fuses, and thereby, the wiring layers 30a, 30b, 30c and 30d are likely to be cut off.

SUMMARY

In one embodiment of the present invention, a fuse set includes: a plurality of fuses arranged with a predetermined spacing; and a connection part electrically connecting one ends of the plurality of fuses and disposed on a plane under a plane of the plurality of fuses.

In another embodiment of the present invention, a fuse set includes: a first row constituted by a plurality of fuses which are arranged with a first spacing; a second row including a plurality of fuses which are disposed to correspond to the fuses of the first row on the same plane, and separated from the fuses of the first row with a second spacing; and a connection part disposed between the first row and the second row and electrically coupled with the plurality of fuses of the first row and the plurality of fuses of the second row, wherein the connection part and the pluralities of fuses of the first and second rows are disposed on different planes.

DETAILED DESCRIPTION

Figure 2:
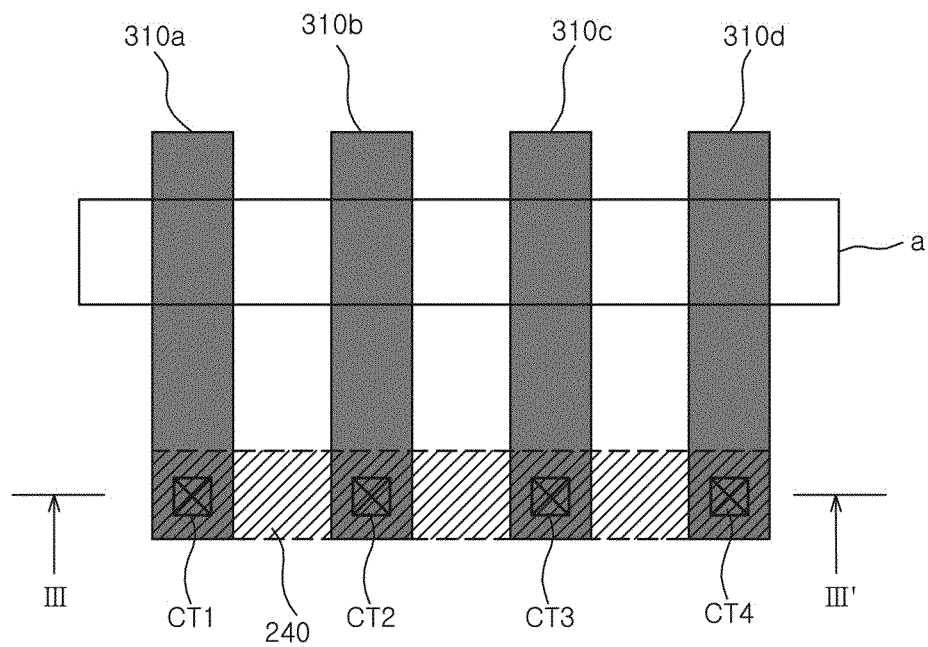
FIG. 2 is a plan view illustrating a fuse set in accordance with an embodiment of the present invention.

FIG. 2 is a plan view illustrating a fuse set in accordance with an embodiment of the present invention.

Referring to FIG. 2, a fuse set 300 includes a plurality of fuses, for example, first to fourth fuses 310a, 310b, 310c, and 310d, and a connection part.

For example, the first to fourth fuses 310a to 310d may have the shape of bars and may be disposed with a predetermined spacing. The connection part 240 electrically connects one ends of the first to fourth fuses 310a to 310d with one another. The connection part 240 may be disposed in such a way as to partially overlap with the fuses 310a to 310d and be substantially perpendicular to the fuses 310a to 310d. Contacts CT1 to CT4 are formed at portions where the connection part 240 and the fuses 310a to 310d overlap.

Figure 1:
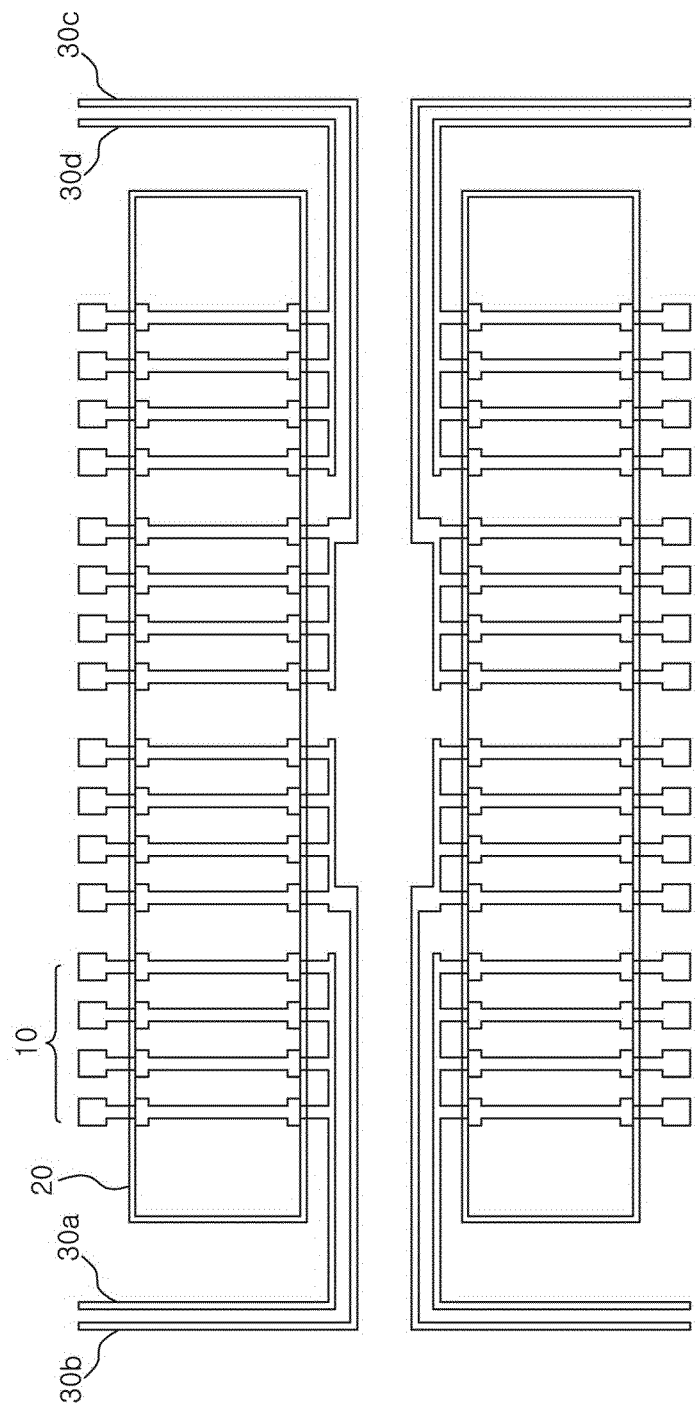
FIG. 1 is a plane view showing an example of a fuse box in a conventional column fuse block.

In the present embodiment, in order to prevent the occurrence of a blowing error, the connection part 240 may be disposed on a different plane from the plane of the fuses 310a, 310b, 310c and 310d. As is generally known in the art, the plurality of fuses 310a, 310b, 310c and 310d should be disposed to be separated from one another by a distance no less than a laser radiation range. However, in the case where the fuses 310a, 310b, 310c and 310d and the connection part 250 are disposed on the same plane, it is difficult for the fuses 310a, 310b, 310c and 310d and the connection part 240 to be separated by the distance no less than the laser radiation range. Therefore, when cutting the fuses, laser beams are likely to be transferred to portions of the connection part 240, and due to this fact, the connection part 240 is likely to be damaged from the laser beams. In this case, an error is likely to occur in a repair signal, and a problem is likely to be caused in an entire redundancy operation. In FIG. 1, the letter 'a' designates a laser blowing region.

However, in the present embodiment, as the connection part 240 is disposed to be positioned on the different plane from the plane of the fuses 310a, 310b, 310c and 310d, even though the fuses 310a, 310b, 310c and 310d and the connection part 240 are adjacently disposed when viewed on the top, since a second interlayer dielectric layer 270 is present between the fuses 310a, 310b, 310c and 310d and the connection part 240, a separation distance no less than the thickness of the second interlayer dielectric layer 270 may be secured.

A cross-sectional structure will be described below in detail with reference to FIG. 3.

Figure 3:
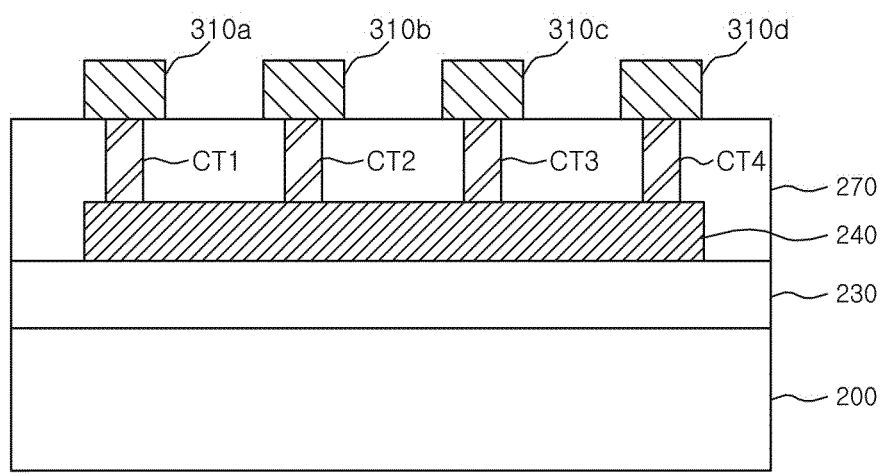
FIG. 3 is a cross-sectional view taken along the line III-III' of FIG. 2.

Referring to FIG. 3, the connection part 240 is formed over a semiconductor substrate 200 which has a first interlayer dielectric layer 230. After forming the second interlayer dielectric layer 270 over the connection part 240, a plurality of contact holes (not shown) are defined in such a way as to expose predetermined portions of the connection part 240. By filling a conductive substance in the respective contact holes, the first to fourth contacts CT1, CT2, CT3 and CT4 are formed. After depositing a metal layer over the second interlayer dielectric layer 270 in which the first to fourth contacts CT1, CT2, CT3 and CT4 are formed, the first to fourth fuses 310a, 310b, 310c and 310d are formed to respectively contact the first to fourth contacts CT1, CT2, CT3 and CT4.

In this way, as the connection part 240 is disposed under the fuses 310a, 310b, 310c and 310d, even when implementing laser blowing, the connection part 240 is not adversely influenced, by which it is possible to prevent the occurrence of a fuse error.

Figure 4:
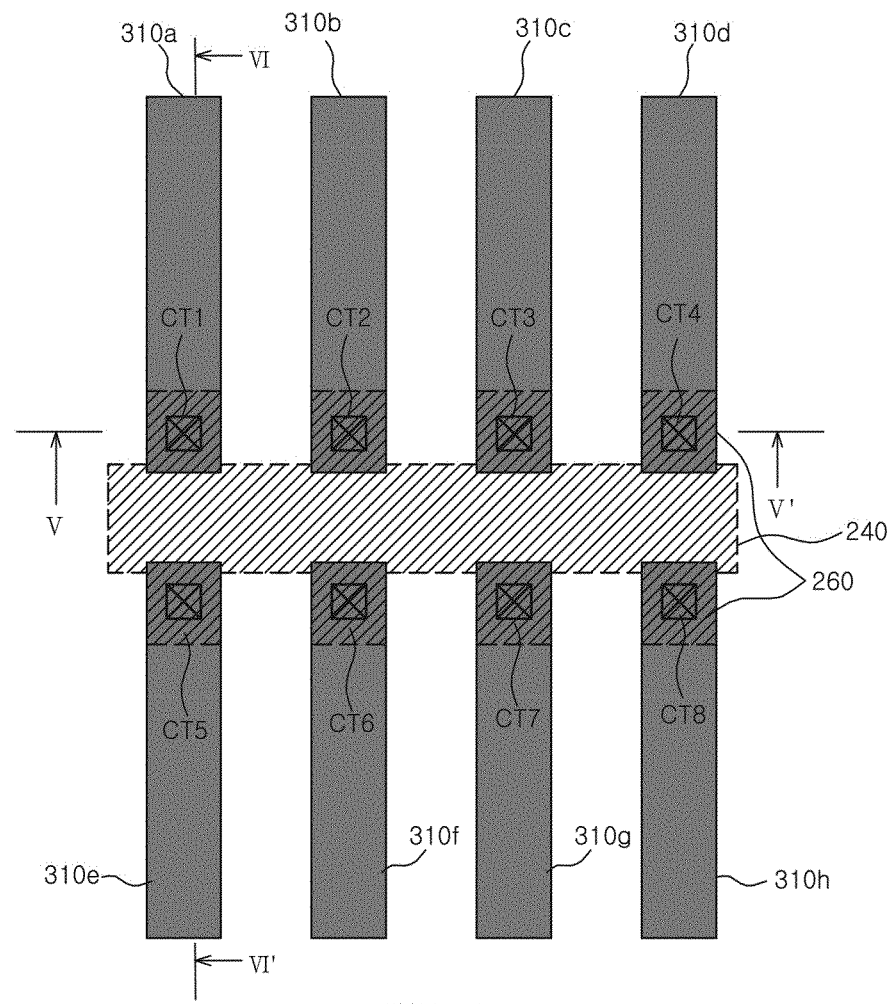
FIG. 4 is a plan view illustrating a fuse set in accordance with another embodiment of the present invention.

FIG. 4 is a plan view illustrating a fuse set in accordance with another embodiment of the present invention.

To achieve higher integration, the number of fuses in a fuse set may be increased in a semiconductor integrated circuit. Referring to FIG. 4, in order to integrate even more fuses in one fuse set, a fuse set 300a may include a plurality of fuses 310a to 310h arranged in two rows with respect to a connection part 260, to which the plurality of fuses 310a to 310h are connected.

For example, for a fuse set comprising eight fuses as shown in FIG. 4, each pair of fuses (such as 301a and 310e or 310b and 310f or 310c and 310g or 310d or 310h) may be arranged side by side with respect to the connection part 260 to make connection thereto, thereby forming two rows of fuses.

That is, the first to fourth fuses 310a to 310d may be disposed along a first row with a predetermined spacing, and the fifth to eighth fuses 310e to 310h may be disposed along a second row with the predetermined spacing in such a way as to respectively correspond to the first to fourth fuses 310a to 310d. As above mentioned, each of the fuses 310a-310h has a bar structure that extends to the column direction. The first to fourth fuses 310a to 310d of the first row and the fifth to eighth fuses 310e to 310h of the second row may be separated from each other, for example, by a width corresponding to the line width of the fuses 310a to 310h.

The connection part 240 is disposed between the first to fourth fuses 310a to 310d of the first row and the fifth to eighth fuses 310e to 310h of the second row in such a way as to be substantially perpendicular to the fuses 310a to 310h. The connection part 240 may include projections 260 to overlap with the respective fuses 310a to 310h. The respective projections 260 may have substantially the same line width as the fuses 310a to 310h.

The projections 260 respectively contact the corresponding fuses 310a to 310h by way of first to eighth contacts CT1 to CT8.

The connection part 240 including the projections 260 may be disposed on a different plane from the plane of the fuses 310a to 310h. For example, the connection part 240 may be disposed on a plane under the fuses 310a to 310h.

Figure 5:
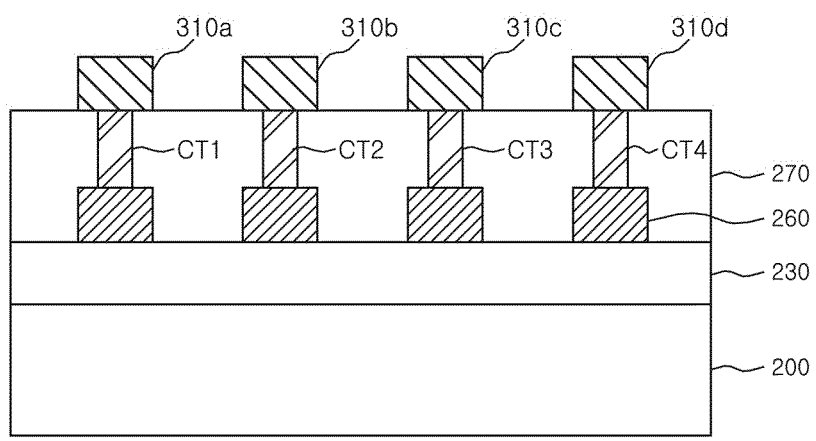
FIG. 5 is a cross-sectional view taken along the line V-V' of FIG. 4.
Figure 6:
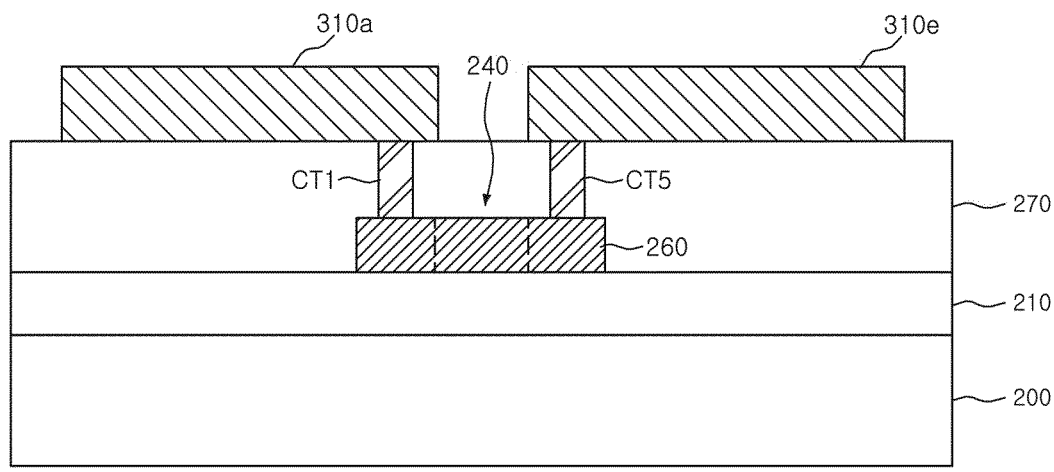
FIG. 6 is a cross-sectional view taken along the line VI-VI' of FIG. 4.

Describing in detail with reference to FIGS. 5 and 6, a conductive layer is deposited over a semiconductor substrate 200 which is formed with a first interlayer dielectric layer 230, and by etching a predefined portion of the conductive layer, the connection part 240 having the plurality of projections 260 is formed. Circuit elements constituting a semiconductor integrated circuit may be disposed between the first interlayer dielectric layer 230 and the semiconductor substrate 200. A second interlayer dielectric layer 270 is formed over the first interlayer dielectric layer 210 in which the connection part 240 is formed. By etching the second interlayer dielectric layer 270 in such a way as to expose portions corresponding to the projections 260, contact holes (not shown) are defined. By filling a conductive layer in the contact holes as is generally known in the art, the first to eighth contacts CT1 to CT8 are formed. A conductive layer (not shown) is deposited over the second interlayer dielectric layer 270, and by etching the conductive layer in such a way as to respectively contact the first to eighth contacts CT1 to CT8, the first to eighth fuses 310a to 310h are formed.

Figure 7:
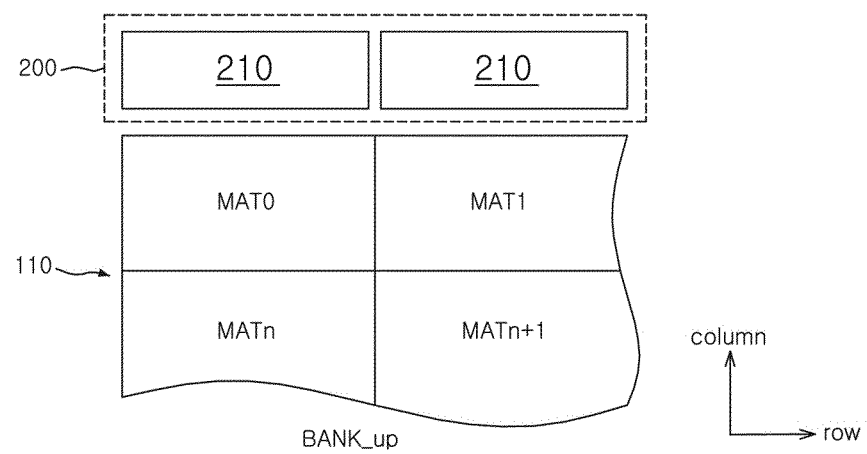
FIG. 7 is an enlarged plane view showing a stack bank and a column fuse block according to one embodiment.

FIG. 7 is an enlarged plane view showing a stack bank 110 and a column fuse block 200 according to one embodiment.

Referring to FIG. 7, the stack bank 110 can include the up-bank and the down-bank (not shown) and a plurality of memory cell array (hereinafter, 'mat') that forms one of the up and down-banks. The mats are arranged in a matrix type with a mat column and a mat row.

Meanwhile, the column fuse block 200 can include a plurality of fuse boxes 210. The plurality of the fuse boxes 210 can be arranged, for example, in a row direction with a constant interval. Furthermore, each of the fuse boxes 210 can be disposed to correspond to the one mat, especially to the mat row.

Figure 8:
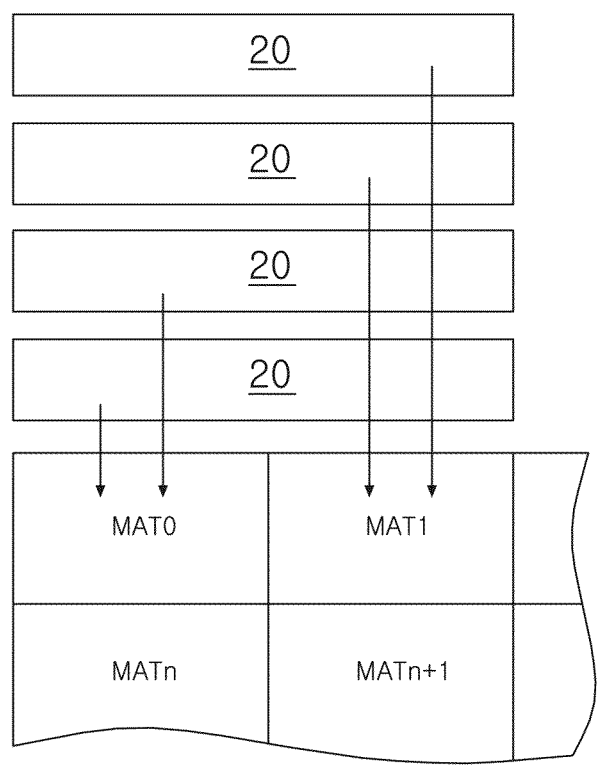
FIG. 8 is a schematic view illustrating the relationship between fuse boxes and mats in a conventional semiconductor integrated circuit.

Here, as shown in FIG. 8, conventional fuse boxes 20 are disposed to correspond to two adjacent mats in a row direction, for example, having four rows. At this time, the two fuse boxes 20 are related to a column repair of a first mat MAT0 and other two fuse boxes 20 are related to a column repair of a second mat MAT1.

On the other hand, in one embodiment, since one fuse box 210 correspond to one mat column, then this arrangement can reduce an area of the column fuse blocks 200, which will be illustrated in more detailed below.

Figure 9:
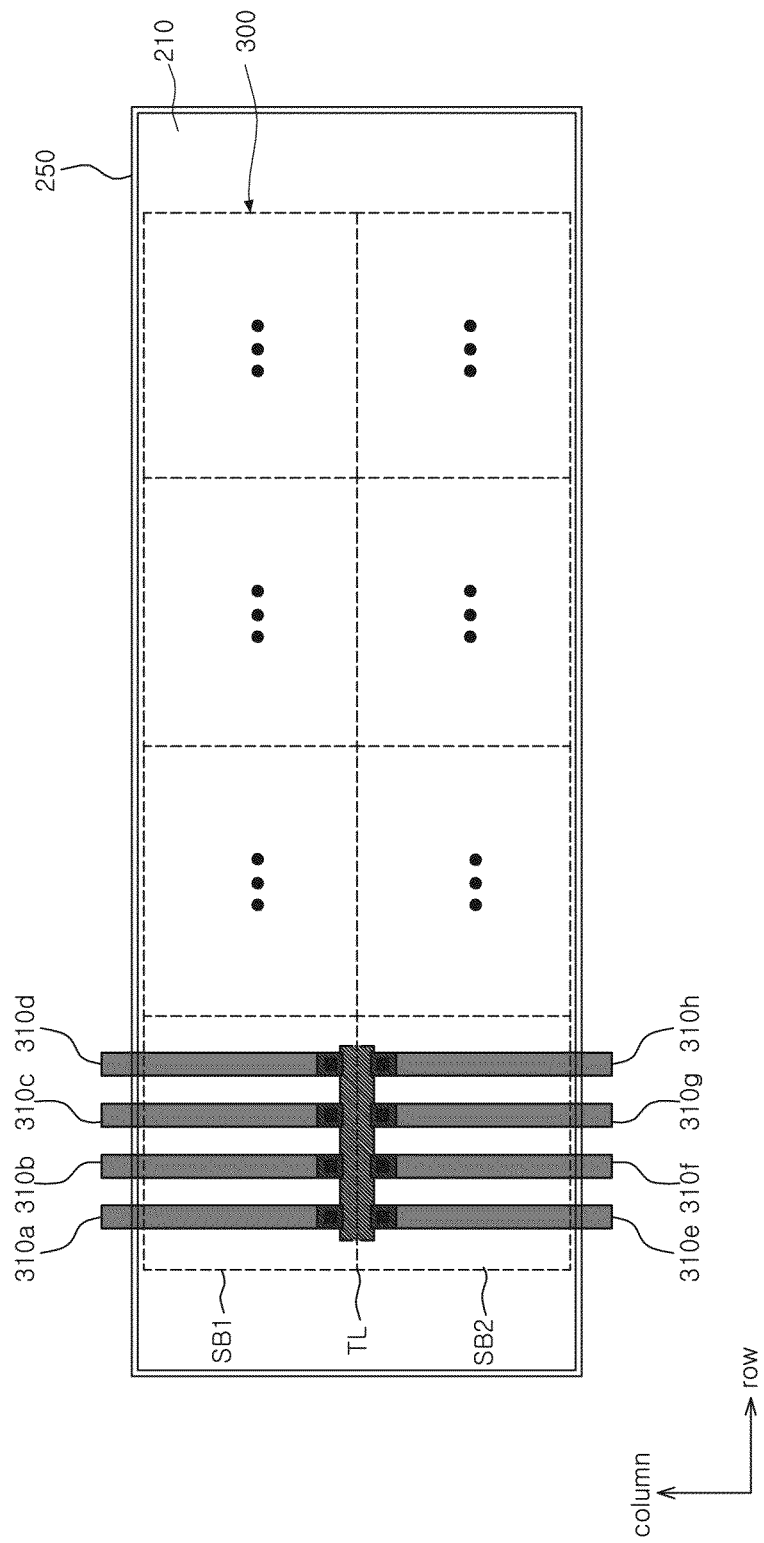
FIG. 9 is a plane view showing a fuse box according to one embodiment.

FIG. 9 is a plane view showing the fuse box according to one embodiment.

Referring to FIG. 9, the fuse box 210 can include a plurality of fuse sets 300a. First, the fuse box 210 can be defined by a guard ring 250. The guard ring 250 can be a moisture-proof layer to prevent moisture from percolating towards the fuses. For example, this guard ring can be made of a metal wire.

The number of fuse sets 300a can be included in the fuse box 210 as much as the number of the mats in the same column, i.e., as much as the number of the mats to form one mat column. In one embodiment, since the semiconductor memory device has banks, each of which is classified into eight blocks as exemplarily illustrated, then the four fuse sets 300a can be included in the fuse box 210.

The fuse sets 300a according to one embodiment can be arranged in two rows the fuse box 210. In one embodiment, the fuse set 300a which is disposed in one row is referred to as a sub-block.

Accordingly, for example, each of first and second sub-blocks SB1 and SB2 can comprise of four fuse sets 300a. The first and second sub-blocks SB1 and SB2 can be disposed symmetrically around their center line TL.

Each of the fuse sets 300a can include a plurality of address fuses 310a to 310h. An interconnection part that finally transfers information of the address fuses 310a to 310h to the column control block (not shown) through a column redundancy circuit block can be the connection part 240. As above mentioned, a plane formed on the address fuses 310a to 310b is different from that formed on the connecting part 240. Furthermore, one end of each of the address fuses 310a, 310b, 310c and 310d can be electrically coupled to the connection part 240 through the contacts CT1 to CT 8. At that time, the connection part 240 of the first and second sub-blocks SB1 and SB2 are disposed at the center of the fuse box 210, and are disposed in a vicinity adjacent to the center line TL.

Figure 10:
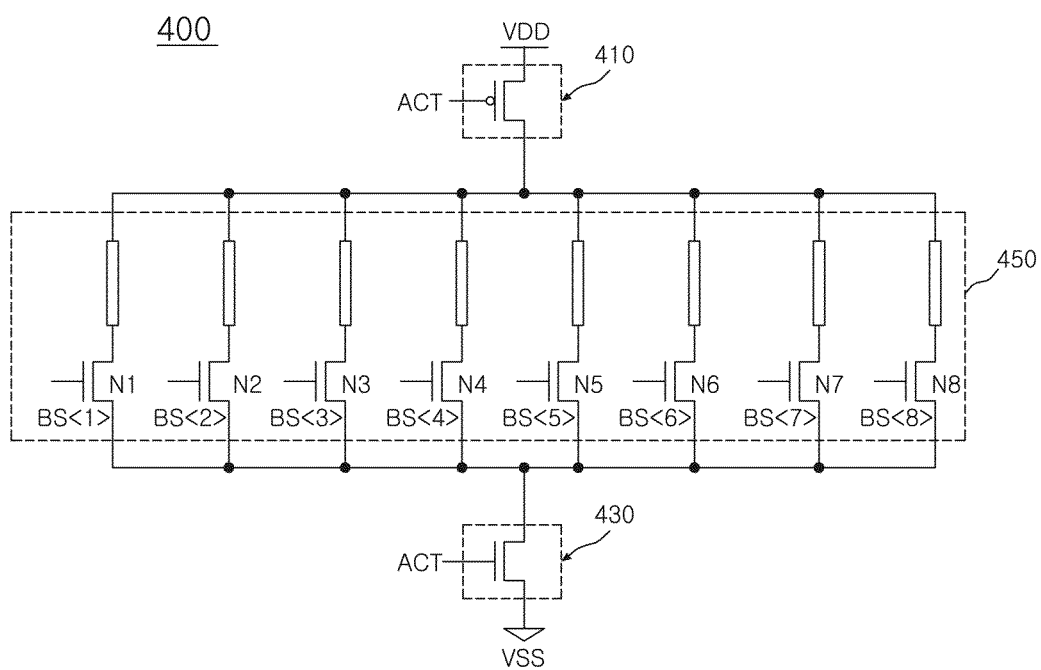
FIG. 10 is a circuit diagram illustrating a column address fuse circuit in accordance with another embodiment of the present invention.

FIG. 10 is a circuit diagram illustrating a column address fuse circuit in accordance with another embodiment of the present invention.

Referring to FIG. 10, a column address fuse circuit 400 may include a first driving unit 410, a second driving unit 430, and a blowing confirmation unit 450.

The first driving unit 410 is connected between the terminal of a power supply voltage VDD and the blowing confirmation unit 450, and is configured to switch the power supply voltage VDD to the blowing confirmation unit 450 in response to an active signal ACT. Such first driving unit 410 may be, for example, a PMOS transistor.

The second driving unit 430 is connected between the blowing confirmation unit 450 and the terminal of a ground voltage VSS. The second driving unit 430 may be constituted by, for example, an NMOS transistor, and is configured to discharge the voltage transferred to the blowing confirmation unit 450 to the terminal of the ground voltage VSS in response to the active signal ACT.

The blowing confirmation unit 450 may be constituted by a plurality of fuses 310a to 310h and switching elements N1 to N8 which respectively correspond to the fuses 310a to 310h. The blowing confirmation unit 450 is configured to output a high signal if any one of the fuses 310a to 310h is blown when the first driving unit 410 is driven. The respective switching elements N1 to N8 may be NMOS transistors which are driven in response to block selection signals BS<1:8>.

Connection nodes between the first driving unit 410 and the blowing confirmation unit 450 may be the output terminals of the blowing confirmation unit 450, and that is, may correspond to the connection part 255 shown in FIG. 4.

As is apparent from the above descriptions, in the embodiment of the present invention, one ends of a plurality of fuses constituting a fuse set are connected with one another, and a connection part thereof is disposed on a different plane from the plane of the fuses. According to this fact, when subsequently blowing the fuses, the connection part is prevented from being adversely influenced by laser beams. Therefore, since the connection part is prevented from being damaged by the laser beams, the occurrence of a fuse repair error can be avoided.

What is claimed is:

1. A fuse set comprising:
    a plurality of fuses arranged with a predetermined spacing; and
    a connection part electrically coupling one ends of the plurality of fuses and disposed on a plane under a plane of the plurality of fuses,
    wherein the plurality of fuses have the shape of bars and are disposed along a double row with the predetermined spacing.

2. The fuse set according to claim 1, wherein the connection part is disposed to be substantially perpendicular to the plurality of fuses and is electrically connected with the plurality of fuses by way of contacts 3. The fuse set according to claim 1,
    wherein the double row, along which the plurality of fuses are disposed, are divided into a first row and a second row, and
    wherein fuses of the first row and fuses of the second row are disposed to be symmetric to each other.

4. The fuse set according to claim 3, wherein the fuses of the first row and the fuses of the second row are disposed to be separated from each other by a preselected gap, and
    wherein the connection part is disposed between the fuses of the first row and the fuses of the second row.

5. The fuse set according to claim 4, wherein the connection part includes projections which project to overlap with the fuses of the first row and the fuses of the second row.

6. The fuse set according to claim 4, wherein the contacts are disposed over the projections.

7. The fuse set according to claim 1, wherein the connection part and the plurality of fuses are disposed up and down with a dielectric layer interposed therebetween.

8. A semiconductor integrated circuit comprising:
    a bank having a plurality of mats are arranged in row and column directions along a constant interval; and
    a column fuse block disposed at an edge of the bank, the column fuse block having a plurality of fuse boxes,
    wherein each fuse box has a plurality of fuse sets which are arranged in two rows and each fuse box is disposed to correspond to the mats,
    wherein each of the fuse sets includes:
    a first row constituted by a plurality of fuses which are arranged with a first spacing;
    a second row including a plurality of fuses which are disposed to correspond to the fuses of the first row on the same plane, and separated from the fuses of the first row with a second spacing; and
    a connection part disposed between the first row and the second row and electrically connected with the plurality of fuses of the first row and the plurality of fuses of the second row,
    wherein the connection part and the pluralities of fuses of the first and second rows are disposed on different planes.

9. The semiconductor integrated circuit according to claim 8, wherein the connection part includes a plurality of projections which project to respectively overlap with the plurality of fuses of the first row and the plurality of fuses of the second row.

10. The semiconductor integrated circuit according to claim 9, further comprising:

a plurality of contacts connecting the projections of the connection part with the plurality of fuses of the first row and the plurality of fuses of the second row.

11. The semiconductor integrated circuit according to claim 8, wherein a dielectric layer is interposed between the connection part and the pluralities of fuses of the first and second rows.

12. The semiconductor integrated circuit according to claim 11,
wherein the dielectric layer is disposed over the connection part, and
wherein the pluralities of fuses are disposed over the dielectric layer.

13. The semiconductor integrated circuit of claim 8, wherein the fuse box is defined within a guard ring that prevents moisture from percolating into the fuse box.

* * * * *